United States Patent
Moy et al.

(10) Patent No.: US 7,757,200 B2
(45) Date of Patent: Jul. 13, 2010

(54) STRUCTURE OF AN APPARATUS FOR PROGRAMMING AN ELECTRONICALLY PROGRAMMABLE SEMICONDUCTOR FUSE

(75) Inventors: Dan Moy, Bethel, CT (US); Stephen Wu, Poughkeepsie, NY (US); Peter Wang, Wappingers Falls, NY (US); Brian W. Messenger, Newburgh, NY (US); Edwin Soler, Wallkill, NY (US); Gabriel Chiulli, Middlebury, CT (US)

(73) Assignee: International Business Machines Corporation, Armonk, NY (US)

( * ) Notice: Subject to any disclaimer, the term of this patent is extended or adjusted under 35 U.S.C. 154(b) by 411 days.

(21) Appl. No.: 11/941,308

(22) Filed: Nov. 16, 2007

(65) Prior Publication Data

US 2009/0128225 A1    May 21, 2009

(51) Int. Cl.
*G06F 17/50* (2006.01)
*H01H 85/00* (2006.01)
*H01L 29/00* (2006.01)

(52) U.S. Cl. .............................. 716/17; 716/1; 327/525; 257/529

(58) Field of Classification Search .................... 716/1, 716/16–17; 327/525; 257/529
See application file for complete search history.

(56) References Cited

U.S. PATENT DOCUMENTS

| 6,624,499 | B2 | 9/2003 | Kothandaraman et al. |
| 2005/0189613 | A1 | 9/2005 | Otsuka et al. |
| 2005/0237841 | A1 | 10/2005 | Wu et al. |
| 2005/0286332 | A1 | 12/2005 | Uvieghara |
| 2006/0044049 | A1 | 3/2006 | Ouellette et al. |
| 2006/0087001 | A1 | 4/2006 | Kothandaraman et al. |
| 2006/0108662 | A1 | 5/2006 | Kothandaraman et al. |
| 2008/0006909 | A1 * | 1/2008 | Maleville .................... 257/620 |

OTHER PUBLICATIONS

J.R. Lloyd, "Electromigration for Designers: An Introduction for Non-Specialist", http://www.techonline.com/community/ed_resource/feature_article/20421, 10 pages.

* cited by examiner

*Primary Examiner*—Stacy A Whitmore
(74) *Attorney, Agent, or Firm*—Ian D. MacKinnon

(57) ABSTRACT

A design structure for an apparatus for programming an electronically programmable semiconductor fuse. The apparatus applies a programming current to a fuse link as a series of multiple pulses. Application of the programming current as a series of multiple short pulses provides a level of programming current sufficiently high to ensure reliable and effective electromigration while avoiding exceeding temperature limits of the fuse link.

5 Claims, 5 Drawing Sheets

STRUCTURE OF AN APPARATUS FOR PROGRAMMING AN ELECTRONICALLY PROGRAMMABLE SEMICONDUCTOR FUSE

CROSS REFERENCE TO RELATED APPLICATIONS

The subject matter of this application is generally related to that of co-pending U.S. patent application Ser. No. 11/548,482, filed Oct. 11, 2006.

BACKGROUND OF THE INVENTION

The invention relates generally to electronically programmable semiconductor fuses, and more particularly to an apparatus for programming an electronically programmable semiconductor fuse, and to the design structure upon which a design of such an apparatus resides.

Programmable semiconductor fuse devices are known in the art. For example, with reference to FIGS. 1-5, and initially to FIGS. 1 and 2, U.S. Patent Application Publication Nos. 2006/0087001 (Kothandaraman et al., the "'001 reference") and 2006/0108662 (Kothandaraman et al., the "'662 reference"), both of which are assigned to the same assignee as the present application, disclose an electronically programmable semiconductor fuse assembly (or "eFuse") 10 including a first conductive area 12 and a second conductive area 14 coupled by a fuse link 16. The '001 reference and the '662 reference are incorporated herein by reference in their entirety. The first and second conductive areas 12 and 14, as well as the fuse link 16 are formed from a polysilicon layer 24 and a metallic silicide layer 26 deposited over an insulating layer 22. As discussed in the '001 reference, the polysilicon layer 24 preferably includes a dopant. The insulating layer 22 may be formed, for example, from silicon oxide. The insulating, polysilicon, and silicide layers 22, 24, and 26, respectively, are formed on a semiconductor substrate 20. A capping barrier layer (not shown) formed, for example, from silicon nitride, may be provided over the insulating, polysilicon, and metallic silicide layers 22, 24, 26, respectively. The first and second conductive areas 12 and 14 are provided with contacts 18. The contacts are preferably formed from a metal such as tungsten.

An eFuse 10 programmed by an electromigration process changes from having a first resistance in an unprogrammed state to a second resistance, significantly higher than the first resistance, in a programmed state. To program the eFuse 10, a potential is applied across the fuse link 16 generating a programming current and raising the temperature of the fuse link 16. The electromigration process is affected by both the resultant current density within the fuse link 16, as well as by the temperature generated as a result of Joule heating generated by the current flow within the fuse link 16. With application of sufficient programming current, electromigration of metal within the silicide layer 26 occurs, with migration of the metal toward the anodic conductive area. Also, the dopant in the polysilicon layer 24 migrates toward the anodic conductive area. With migration of metal in the silicide layer 26 and of dopant in the polysilicon layer 24, the resistance of the fuse link 16 increases.

Programming an eFuse 10 requires providing a programming current of sufficient magnitude to reliably cause the desired degree of electromigration within the fuse link 16. However, exceeding the desired level of programming current can lead to excessive fuse link temperatures $T_{FL}$. Specifically, the fuse link 16 has a rupture temperature $T_R$ at which the fuse link 16 is physically ruptured. Such rupture (uncontrolled explosion) of the fuse link 16 is undesirable as it can damage both the fuse link 16 as well as surrounding portions of the semiconductor device, rendering the eFuse 10 unsuitable for use. There is thus a relatively narrow range within which the programming current is both sufficiently large to cause an effective level of electromigration and sufficiently small to avoid heating the fuse link 16 beyond the rupture temperature $T_R$.

The artisan will appreciate that variations inherent in the semiconductor manufacturing process can affect the range of acceptable programming current. For example, variations in the geometry or material composition of the fuse link 16 can decrease the range of acceptable programming current.

With reference now to FIG. 3, it is known to control the programming process of the programmable fuse 10 using a prior art current supply 40 comprising a programming field effect transistor (FET) 30 operatively coupled to control circuitry 32. The control circuitry 32 may include, for example, a pulse generator, one or more logic gates, or other conventional electrical components. The control circuitry is used to generate a pulse of voltage Vgs delivered to the gate of the programming FET 30. The eFuse 10 designer selects set points for programming FET gate voltage Vgs and programming voltage $V_{FS}$ corresponding to a programming current within the desired range of programming currents. For example, it is known in the art to generate a voltage pulse Vgs, typically having a magnitude in the range of 1.5 to 3.3 V, for a duration typically in the range of 5 to 250 microseconds, while simultaneously applying a programming voltage $V_{FS}$, typically in the range of 1.0 to 3.5 V. With reference to FIG. 4, in one example of a prior art current supply 40, assuming application of a programming FET gate voltage Vgs of 2.0 V, in combination with a programming voltage $V_{FS}$ of 2.0 V, a programming current of roughly 15 mA is generated.

With continued reference to FIG. 4, it is noted that operation of the programming FET 30 in the transistor's saturation region, rather than in the linear region, is desirable, as in the saturation region, the programming current is relatively stable and insensitive to variations in the programming voltage. In the linear region, the programming current is substantially more sensitive to variation in the programming voltage. As discussed above, given that it is necessary to control the programming current within a specific range, additional variability in the programming current resulting from operating in the linear region is undesirable.

With reference to FIG. 5, the set points chosen for Vgs and $V_{FS}$ result in a theoretically satisfactory programming current (that is, a programming current sufficient to generate the desired degree of electromigration, without inducing a temperature in the fuse link 16 which exceeds the rupture temperature $T_R$). However, given variability in the characteristics of the eFuse 10 device (including both the current supply 40 and the fuse link 16 itself), it is difficult to obtain a one hundred percent yield in the programming process. That is, some eFuse 10 devices programmed in the conventional manner will have either incomplete electromigration or will rupture due to excessive temperature.

A need exists, therefore, for an apparatus for programming an electronically programmable fuse which allows the eFuse 10 to be reliably programmed while also avoiding application of excessive programming current and the consequent potential for exceeding the rupture temperature of the fuse link 16.

BRIEF SUMMARY OF THE INVENTION

Briefly stated, in a first aspect the invention is a design structure embodied in a machine readable medium for designing, manufacturing, or testing a design. The design structure comprises an apparatus for programming a semiconductor fuse structure including a first conductive area and a second conductive area coupled by a fuse link. The apparatus further includes a current supply including circuitry operatively coupled to the semiconductor fuse to deliver a cyclic programming current as a series of pulses, each pulse having an amplitude and a cycle duration. Programming of the semiconductor fuse is completed upon application of the programming current through the series of multiple pulses. The cycle duration is between about 0.01 and about 0.17 times a thermal time constant of the fuse link.

In a second aspect, the invention is a design structure embodied in a machine readable medium for designing, manufacturing, or testing a design. The design structure comprises an apparatus for programming a semiconductor fuse structure including a first conductive area and a second conductive area coupled by a fuse link. A current supply includes a programmable pulse generator operatively coupled to the semiconductor fuse and programmed to deliver a cyclic programming current as a series of pulses, each pulse having an amplitude and a cycle duration. Programming of the semiconductor fuse is completed upon application of the programming current through the series of multiple pulses. Continuous application of a constant programming current having an amplitude equal to an average of the maximum amplitudes of the series of pulses for a time period equal to a sum of the cycle durations of each of the series of pulses would cause heating of the fuse link to a temperature exceeding a rupture temperature of the fuse link.

BRIEF DESCRIPTION OF THE SEVERAL VIEWS OF THE DRAWINGS

The following detailed description of preferred embodiments of the invention will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
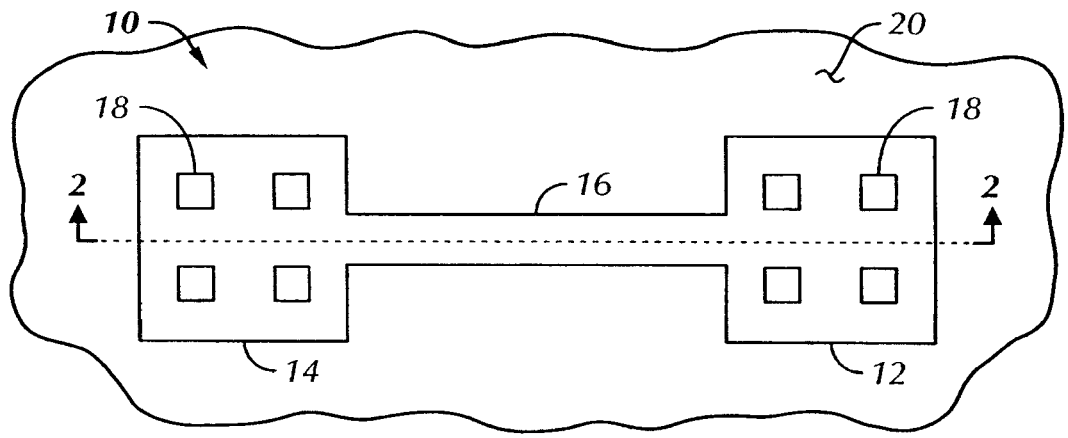
FIG. 1 is a top plan view of an electronically programmable semiconductor fuse device know in the prior art.
Figure 2:
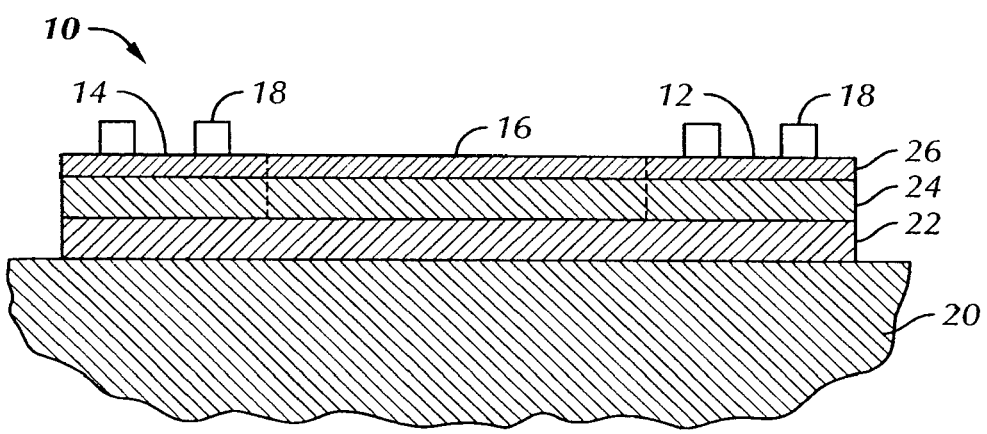
FIG. 2 is a cross-sectional view of the fuse device of FIG. 1, taken along line 2-2 of FIG. 1.
Figure 3:
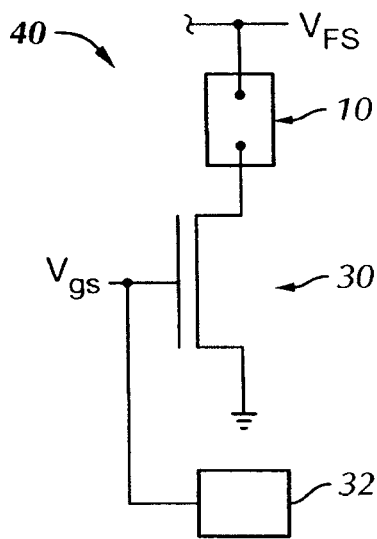
FIG. 3 is a schematic diagram of a known apparatus used to program the fuse device of FIG. 1.

As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIGS. 6-9, there are shown preferred embodiments of a current supply apparatus, generally designated 50, and a method, generally designated 100, in accordance with the present invention.

Figure 7:
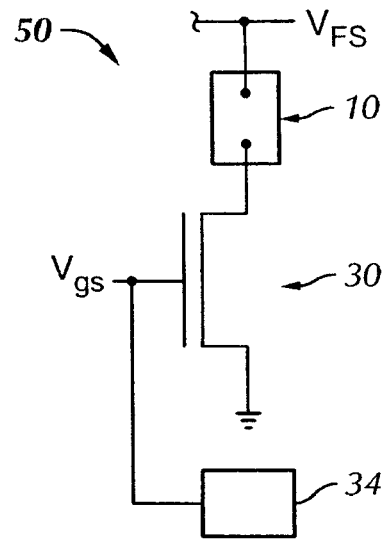
FIG. 7 is a schematic diagram of an apparatus in accordance with the present invention for practicing the method of FIG. 6.
Figure 6:
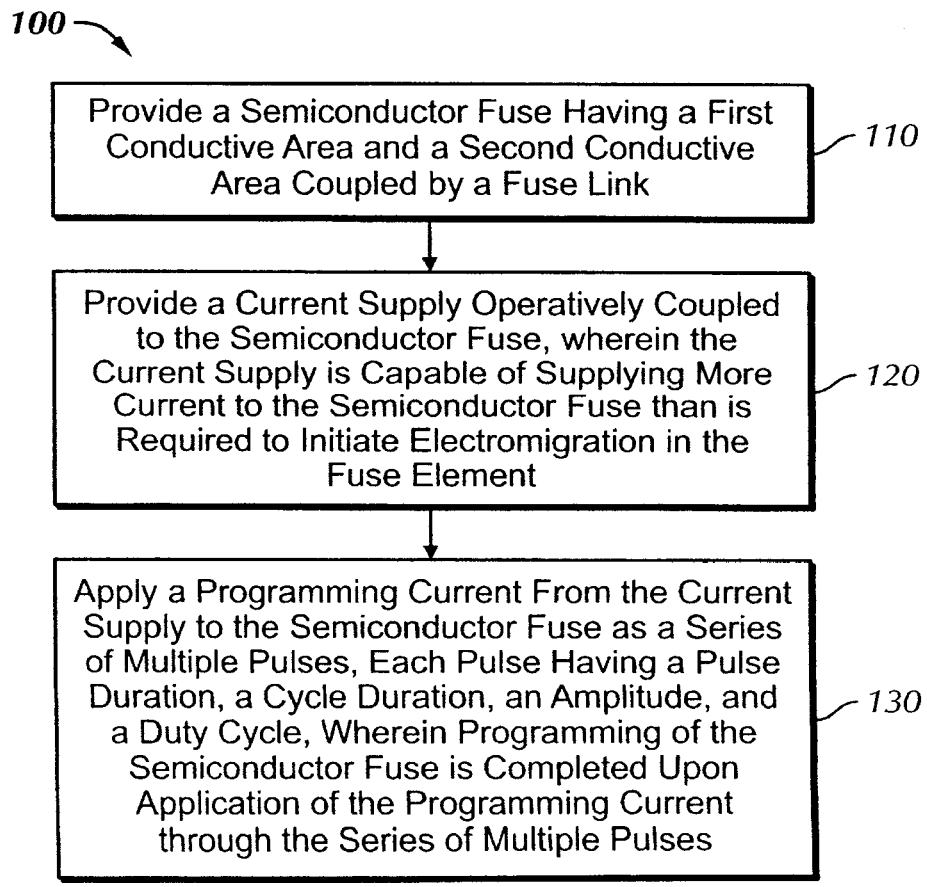
FIG. 6 is a diagram of steps of a method of programming the fuse device of FIG. 1 in accordance with the present invention.
Figure 4:
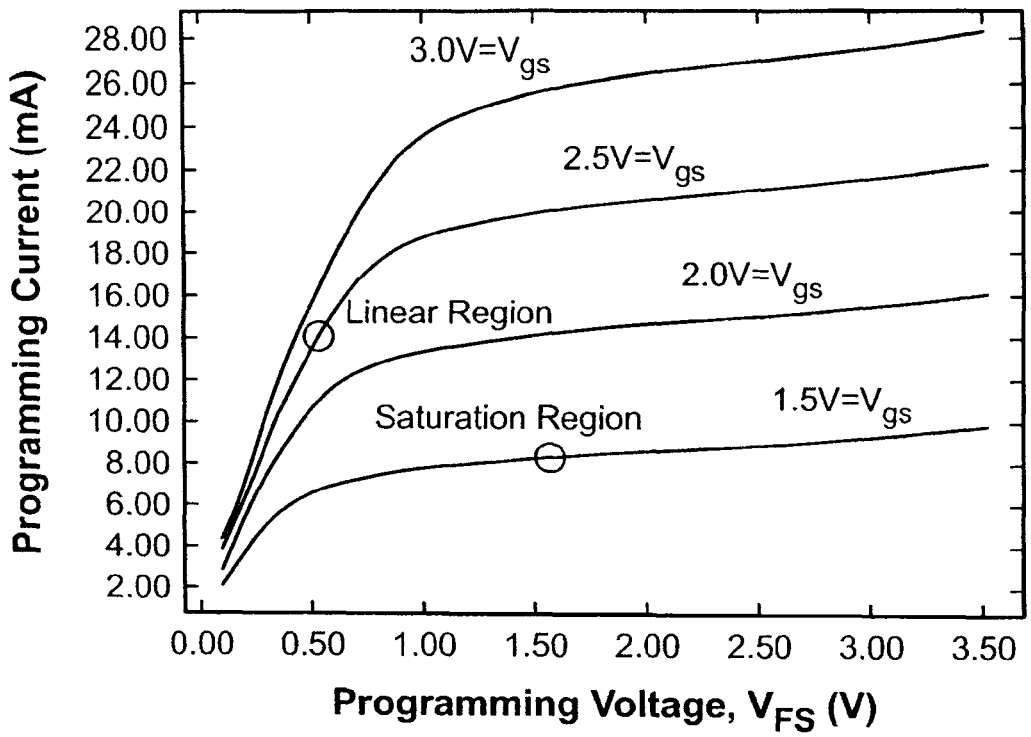
FIG. 4 is a graphical representation of variation of a programming current with a gate voltage and a programming voltage applied to a field effect transistor component of the known apparatus of FIG. 3.
Figure 5:
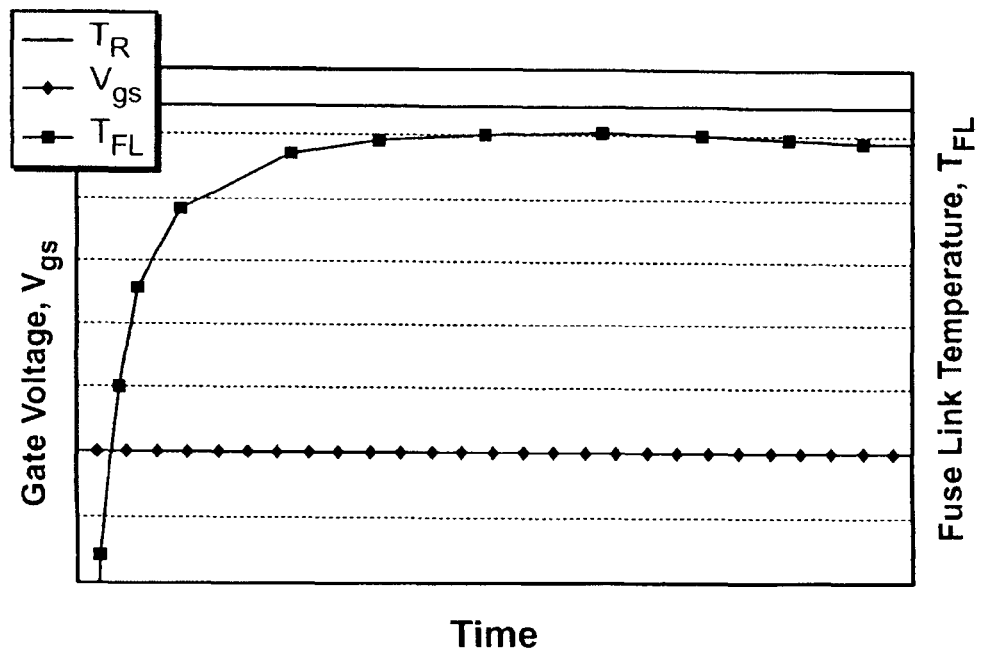
FIG. 5 is a graphical representation of variation of gate voltage in the known apparatus of FIG. 3 and a fuse link temperature in the fuse device of FIG. 1 with time.
Figure 8:
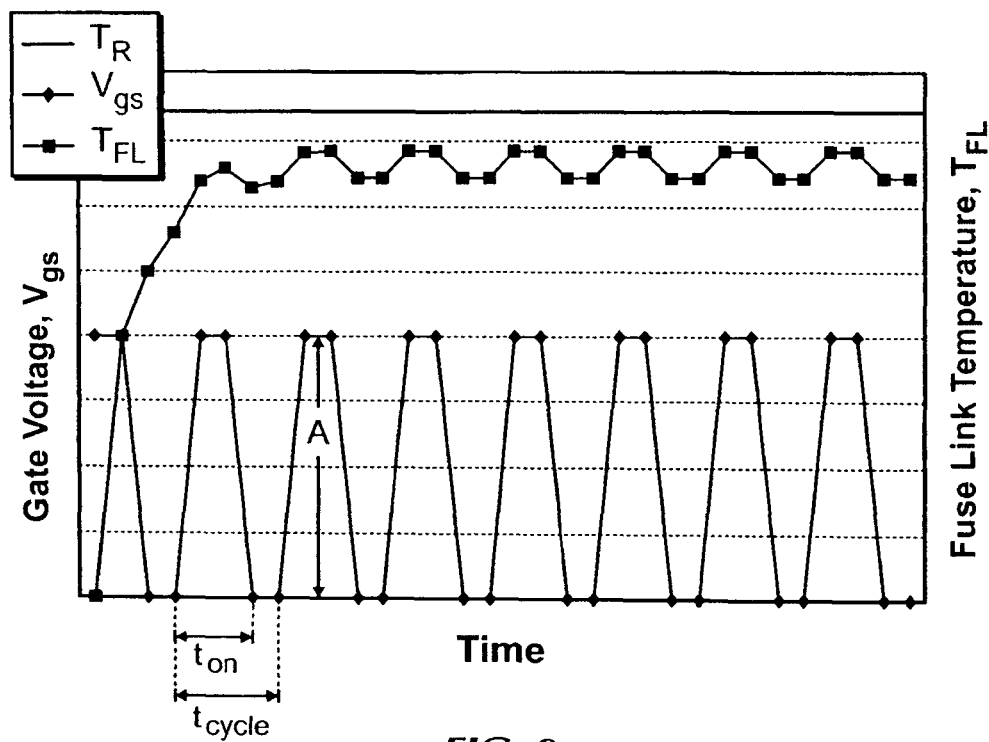
FIG. 8 is a graphical representation of variation of gate voltage generated by the apparatus of FIG. 7 and resulting fuse link temperature in the fuse device of FIG. 1 with time.

With particular reference to FIGS. 6-8, the method 100 of programming the electronically programmable semiconductor fuse or eFuse 10 comprises a step 110 of providing a semiconductor fuse structure including first conductive area 12 and second conductive area 14 coupled by fuse link 16. In a step 120, a current supply 50 operatively coupled to the semiconductor fuse 10 is provided, wherein the current supply 50 is capable of supplying more current to the semiconductor fuse than is required to initiate electromigration in the fuse link. In a step 130, a programming current from the current supply 50 is applied to the semiconductor fuse 10 as series of multiple pulses, each pulse having a pulse duration $t_{on}$, a cycle duration $t_{cycle}$, an amplitude A, and a duty cycle. The duty cycle is defined as the ratio of the pulse duration to the cycle duration (or period of the cycle). The programming of the semiconductor fuse 10 is completed only upon application of the programming current through the series of multiple pulses.

With particular reference now to FIG. 7, the current supply 50 used in conjunction with the programming method 100 includes circuitry 34 (for example, a programmable pulse generator or other circuitry capable of producing gate voltage Vgs as a series of pulses) operatively coupled to the fuse device 10 to deliver the series of multiple pulses. The programming FET 30 used in the current supply 50 is conventional, and operates in the manner discussed above relative to the programming FET 30 of the prior art current supply 40.

The current supply 50 is capable of supplying at least 120 percent of the current required to initiate electromigration in the fuse link 16. If the current supply were capable of producing only 100 percent of the current required to initiate electromigration, use of the method 100 would result in underprogramming. With a current supply capable of supplying between 100 and 120 percent of the current required to initiate electromigration, the duty cycle would be limited to a value greater than 83 percent, providing very little benefit over prior art techniques.

Preferably, in the step 130 of applying the programming current, the programming voltage $V_{FS}$ and the gate voltage Vgs applied to the programming FET 30 are selected to maintain operation of the FET 30 in a saturation operating region of the programming FET 30.

With particular reference now to FIG. 8, the duty cycles of the series of multiple pulses may either be substantially equal as illustrated, or may vary from one pulse cycle to the next. The duty cycle of an initial pulse may be less than that of a final pulse, or vice versa. Similarly, the pulse duration $t_{on}$, cycle duration $t_{cycle}$ (or period), and/or pulse amplitude A of each of the multiple pulses may be substantially equal, or may vary from one cycle to the next. For example, the pulse duration, cycle duration and/or pulse amplitude of an initial pulse may be less than that of a final pulse, or vice versa.

Figure 9:
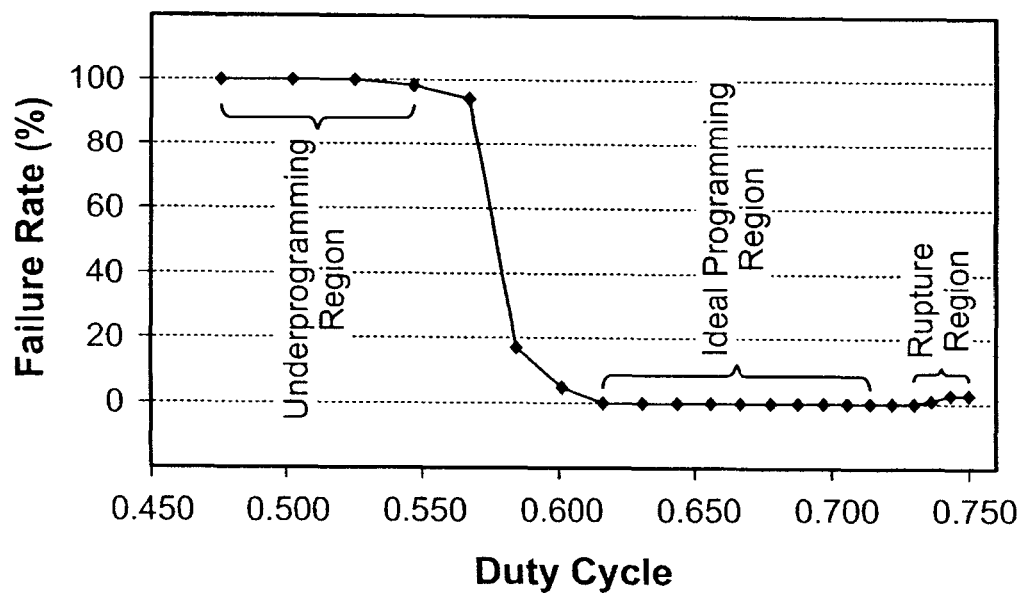
FIG. 9 is a graphical representation of variation of failure rate as a function of a duty cycle of the method of FIG. 6.

With reference now to FIG. 9, preferably, the duty cycle, whether constant or variable from one pulse cycle to the next, is within the range of 0.62 to 0.69. FIG. 9 plots an eFuse programming failure rate as a function of duty cycle. In the illustrated application, the programming voltage $V_{FS}$ was 2.9V, the gate voltage Vgs was 2.6V, for operation of the programming FET 30 in saturation. 350 pulses were employed. The duty cycle was varied by varying the pulse duration (from 9 to 30 nano-seconds) and the cycle duration (from 19 to 40 nanoseconds). The pulse off time was held constant at 10 nanoseconds. For a duty cycle less than approximately 0.55, the failure rate is 100 percent, as the programming current was insufficient to cause electromigration. For a duty cycle between 0.62 and 0.69, the failure rate dropped to zero percent, as within this range the programming current was both sufficient to cause electromigration while also insufficient to cause the fuse link 16 to heat to the rupture temperature $T_R$. For a duty cycle greater than approximately 0.70, the failure rate increased above 0 percent, due to excessive heating of the fuse link 16.

Preferably, the amplitude of each programming current pulse is in the range of about four to about ten milliamps. The cycle duration $t_{cycle}$ (or, alternatively, corresponding frequency) of the programming current pulse is preferably in the range of 5 to 100 nanoseconds. A thermal time constant of a preferred embodiment of the fuse link 16 (that is, the time required for the fuse link 16 to reach 63.2% of it's final temperature when subjected to a step input (such as a programming current) causing a change in temperature) was experimentally determined to be in the range of about 600 to 700 nanoseconds. Thus, the preferred range of cycle durations corresponds to about 0.01 and 0.17 times a thermal time constant. Most preferably, the cycle duration is less than about 30 nanoseconds, corresponding to about 0.05 times the thermal time constant of the fuse link 16, or less.

The artisan will note that the experimentally determined preferred 30 nanosecond limit is influenced not only by the thermal characteristics of the fuse link 16, but also by parasitic capacitances and inductances in other elements of the current supply 50.

The benefit of a cycle duration which is substantially less than the fuse link thermal time constant results from the fact that the electroprogramming process is aided by higher temperatures. With a relatively short cycle duration (relative to the fuse link thermal time constant), the fuse link temperature does not decay significantly between pulses.

The programming method 100 and associated current supply 50 provide the benefits of a relatively high programming current and a relatively constant fuse link temperature (both of which result in reliable initiation of the electromigration process), while mitigating the potential for overheating the fuse link 16. As suggested by the data of FIG. 9, if the programming current were applied continuously for a period of time equal to a sum of the cycle durations of each of the series of pulses, at an amplitude equal to an average of the maximum amplitudes of the series of pulses, the fuse link temperature $T_{FL}$ would reach a level exceeding the rupture temperature $T_R$.

Figure 10:
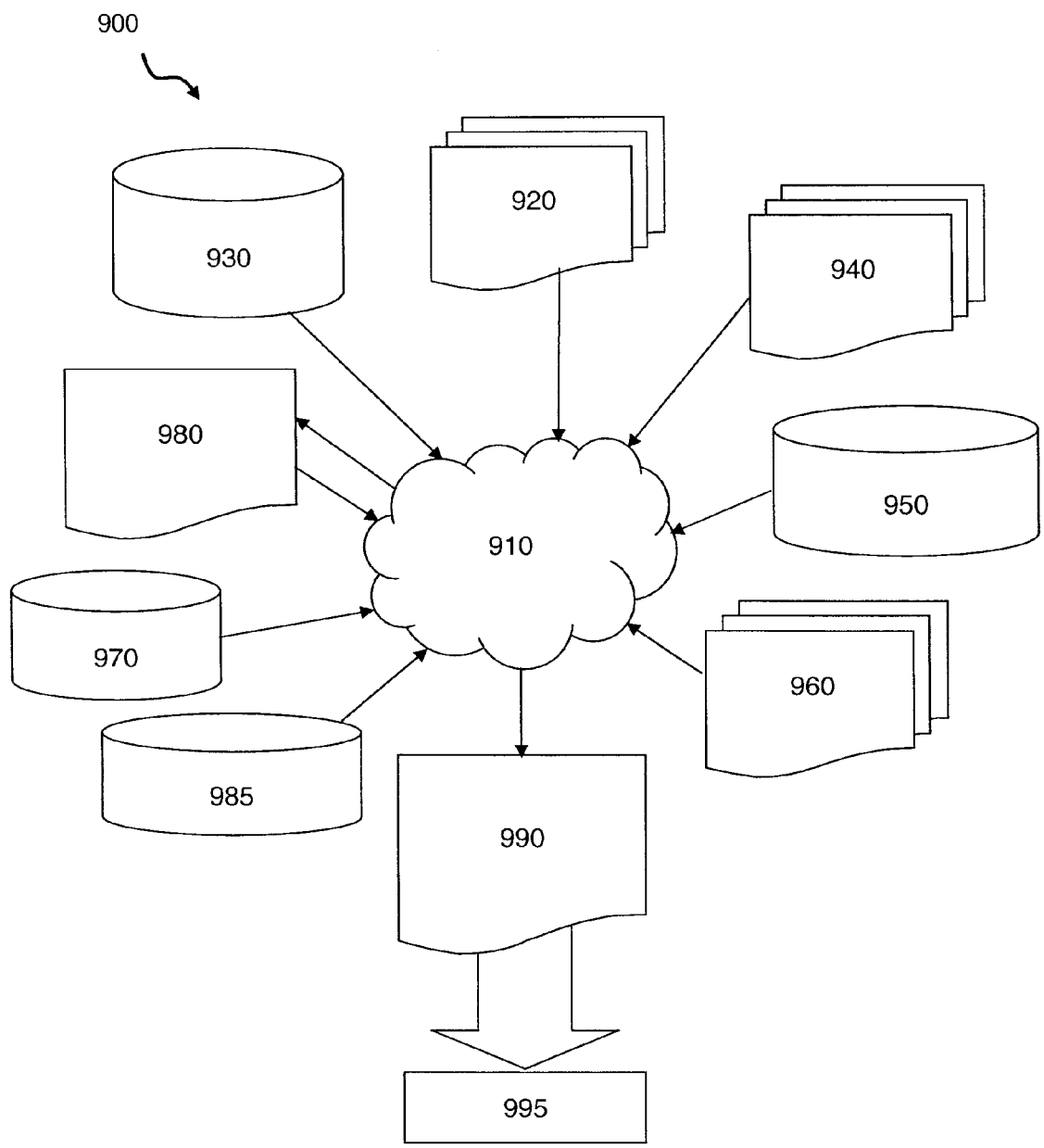
FIG. 10 is a flow diagram of a design process used in semiconductor design, manufacturing, and test activities.

With reference now to FIG. 10, there is shown a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises circuit 100 in the form of schematics or HDL, a hardware-description language (e.g., Verilog, VHDL, C, etc.). Design structure 920 may be contained on one or more machine readable medium. For example, design structure 920 may be a text file or a graphical representation of circuit 100. Design process 910 preferably synthesizes (or translates) circuit 100 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 6-9, along with any additional integrated circuit design or data (if applicable), into a second design structure 990. Design structure 990 resides on a storage medium in a data format used for the exchange of layout data of integrated circuits (e.g. information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 6-9. Design structure 990 may then proceed to a stage 995 where, for example, design structure 990: proceeds to tape-out, is released to manufacturing, is released to a mask house, is sent to another design house, is sent back to the customer, etc.

From the foregoing it can be seen that the present invention provides an apparatus for programming an electronically programmable fuse providing a high level of programming current necessary to reliably and effectively cause electromigration while also avoiding excessive temperature in the fuse link. The present invention further provides a design structure comprising such an apparatus.

It will be appreciated by those skilled in the art that changes could be made to the embodiments described above without departing from the broad inventive concept thereof. It is to be understood, therefore, that this invention is not limited to the particular embodiments disclosed, but it is intended to cover modifications within the spirit and scope of the present invention as defined by the appended claims.

That which is claimed is:

1. A design structure embodied in a machine readable storage medium for designing, manufacturing, or testing a design, the design structure comprising:
    an apparatus for programming a semiconductor fuse structure including a first conductive area and a second conductive area coupled by a fuse link,
    a current supply including circuitry operatively coupled to the semiconductor fuse to deliver a cyclic programming current as a series of pulses, each pulse having an amplitude and a cycle duration,
    wherein programming of the semiconductor fuse is completed upon application of the programming current through the series of multiple pulses and wherein the cycle duration is between about 0.01 and about 0.17 times a thermal time constant of the fuse link.

2. The design structure of claim 1, wherein the design structure comprises a netlist, which describes a circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. A design structure embodied in a machine readable storage medium for designing, manufacturing, or testing a design, the design structure comprising:
    an apparatus for programming a semiconductor fuse structure including a first conductive area and a second conductive area coupled by a fuse link,
    a current supply including a programmable pulse generator operatively coupled to the semiconductor fuse and programmed to deliver a cyclic programming current as a series of pulses, each pulse having an amplitude and a cycle duration,
    wherein programming of the semiconductor fuse is completed upon application of the programming current through the series of multiple pulses and wherein continuous application of a constant programming current having an amplitude equal to an average of the maximum amplitudes of the series of pulses for a time period equal to a sum of the cycle durations of each of the series of pulses would cause heating of the fuse link to a temperature exceeding a rupture temperature of the fuse link.

* * * * *